United States Patent
Matsuo et al.

[19]

[11] Patent Number: 6,114,866
[45] Date of Patent: Sep. 5, 2000

[54] SEMICONDUCTOR DEVICE TEST BOARD AND METHOD FOR EVALUATING SEMICONDUCTOR DEVICES

[75] Inventors: Masaaki Matsuo; Tsuyoshi Saitoh; Takekazu Yamashita, all of Nagasaki; Michio Nakajima; Akira Kitaguchi, both of Tokyo; Hideki Toki, Hyogo, all of Japan

[73] Assignees: Mitsubishi Electric Systems LSI Design Corporation, Hyogo; Mitsubishi Denki Kabushiki, Tokyo, both of Japan

[21] Appl. No.: 09/018,445

[22] Filed: Feb. 4, 1998

[30] Foreign Application Priority Data

Sep. 8, 1997 [JP] Japan ................................. 9-243152

[51] Int. Cl.⁷ .......................... G01R 35/00; G01R 31/02
[52] U.S. Cl. ........................................ 324/760; 324/765
[58] Field of Search ........................... 324/73.1, 158.1, 324/760, 765, 555, 556; 438/16, 17; 257/40, 48; 340/635, 653

[56] References Cited

U.S. PATENT DOCUMENTS 4,900,948 2/1990 Hamilton ............................. 324/73.1
5,673,028 9/1997 Levy ..................................... 324/555
5,798,653 8/1998 Leung, Jr. ............................ 324/760

FOREIGN PATENT DOCUMENTS 1-277779 11/1989 Japan .
402118470 5/1990 Japan .

*Primary Examiner*—Vinh P. Nguyen
*Attorney, Agent, or Firm*—Leydig, Voit & Mayer

[57] ABSTRACT

A semiconductor device test board solves a problem with conventional test boards in that test results obtained through a burn-in procedure could be identified only before the test board is taken out of a burn-in oven. Hence, conventional test boards required additional steps for checking the test results after removing the test boards from the burn-in oven. This extra step prevents the efficiency of the test from being improved. One embodiment of the present test board has indicator arms, each rotatably mounted on a pivot on the test board, for indicating, in response to a signal on a signal line, the test result of the semiconductor device associated with it. Each of the indicator arms maintains its rest position when no failure has occurred in the semiconductor device associated with it during the test. Each indicator arm changes its position if a failure has occurred in the semiconductor device during the test, and retains one of the two positions until after the test board is taken out of the burn-in oven. Thus, the test result can be determined after taking out the test board from the burn-in oven.

4 Claims, 5 Drawing Sheets

SEMICONDUCTOR DEVICE TEST BOARD AND METHOD FOR EVALUATING SEMICONDUCTOR DEVICES

BACKGROUND OF THE INVENTION

1. Field of the Invention

The present invention relates to a semiconductor device test board and an evaluation test method and particularly to an improvement which enables a time-saving, effective evaluation test of semiconductor devices.

2. Description of Related Art

FIG. 8 is a flowchart showing a conventional evaluation test method carried out after assembling semiconductor devices. In FIG. 8, ST1 designates an evaluation test step of evaluating fundamental electrical of characteristics, such as DC (direct current) characteristics; ST2 designates a first quality check step of screening out defective unit identified in the electrical characteristic evaluation test step ST1; ST3 designates a burn-in step of forcedly inducing early failures by putting the semiconductor devices identified as non-defectives in the first quality check step ST2 in a burn-in oven providing a high temperature environment; ST4 designates a performance check evaluation test step of checking performance of the semiconductor devices which have undergone the burn-in procedure by supplying the semiconductor devices with predetermined signal patterns from an LSI tester or the like; and ST5 is a second quality check step of screening out defective unit identified in the performance check evaluation test step ST4.

With a sharp increase of integration density in recent years, the time period consumed by the performance check evaluation test step has markedly increased, and hence effective evaluation test is of critical importance to determining the productivity of semiconductor devices.

FIG. 9 is a block diagram showing a conventional burn-in system improved considering such a situation. In FIG. 9, reference numerals 1 each designate a semiconductor device to be evaluated; 2 each designate a burn-in board (test board) on which a plurality of semiconductor devices 1 are mounted. The reference numeral 3 designates a burn-in oven for containing the burn-in boards 2; 4 designates a power supply embedded in the burn-in oven 3 for supplying power to the burn-in boards 2; and 5 designates an LSI tester provided outside of the burn-in oven 3 for supplying the semiconductor devices on each burn-in board 2 with predetermined test patterns through signal lines, and for retaining results of the test.

With such a burn-in system, it is possible to carry out the performance check by supplying the test signals from the LSI tester 5 to individual semiconductor devices 1 while they are subject to the burn-in process in the burn-in oven 3. Thus, the present burn-in system enables a part of the performance check evaluation test step ST4 in FIG. 8 to be achieved in parallel with the burn-in step ST3, thereby achieving effective evaluation test of the semiconductor devices 1.

Japanese patent application laid-open No. 1-277779/1989 discloses an evaluation test method which simplifies the burn-in system by integrating the functions of the LSI tester 5 into each semiconductor device, and thus reduces cost and evaluation steps. It also discloses a system including thyristors and lamps mounted on the burn-in board. Each thyristor, driven by a signal output from one of the semiconductor devices as a result of the test, turns on the lamp connected to each thyristor once a failure has occurred in the semiconductor device, and keeps the lamp illuminated even if the semiconductor device recovers from the failure during the burn-in process. This makes it possible to check the result of the performance test of the individual semiconductor devices.

With such an arrangement, the conventional burn-in system has a problem in that the test result cannot be checked after the burn-in boards 2 are taken out of the burn-in oven 3. This is because the semiconductor devices are disconnected from the power supply 4, and hence the lamps cannot keep the results of the test. Thus, a new step becomes necessary of separating the non-defective from the defective unit by observing the test results before taking the burn-in boards 2 out of the burn-in oven 3. This will increase the number of steps of the evaluation test and labor (manpower). As a result, an expected improvement in efficiency cannot be achieved considering the evaluation test in its entirety.

SUMMARY OF THE INVENTION

The present invention is implemented to solve the foregoing problem. It is therefore an object of the present invention to provide a semiconductor device test board and a semiconductor device evaluation test method using the semiconductor device test board which can implement a timesaving, effective evaluation test of the semiconductor devices.

According to a first aspect of the present invention, there is provided a semiconductor device test board comprising: a circuit board on which one or more semiconductor devices to be tested are mounted, and wiring is formed for carrying signals and a supply voltage to the semiconductor devices; and one or more indicators, each of which is mounted on the circuit board and associated with one of the semiconductor devices for indicating in a visible manner a test result of the semiconductor device, the indicators retaining the test results after the supply voltage is disconnected from the semiconductor devices.

Here, each of the indicators may comprise: a light emitting device for emitting light when an electric current is applied; a supply controller for controlling supply of the electric current to the light emitting device, the supply controller supplying the light emitting device with the electric current if the test result of the semiconductor device associated with the indicator indicates that a failure has occurred in the semiconductor device; and an internal power supply for supplying power to the light emitting device and the supply controller.

The internal power supply may be recharged by an external power supply applying power to the circuit board.

The semiconductor device test board may further comprise a performance check device for checking the light emitting devices by applying a test current.

Each of the indicators may comprise: an indicator arm rotatably mounted on a pivot on the circuit board; a latch arm rotatably mounted on a pivot on the circuit board, the latch arm having a catch at its free end, the catch being engaged in a free end of the indicator arm; exerting means for exerting a force on the indicator arm in a direction that enables the indicator arm to retain its rest position where it is engaged in the latch arm; and releasing means for releasing the engagement of the latch arm with the indicator arm if the test result of the semiconductor device associated with the indicator indicates that a failure has occurred in the semiconductor device.

The semiconductor device test board may further comprise initializing means for simultaneously setting the indicator arms in the rest position.

According to a second aspect of the present invention, there is provided a semiconductor device evaluation test method comprising steps of: mounting one or more semiconductor devices on a semiconductor device test board; and placing the semiconductor test board in a burn-in oven to undergo an evaluation test, wherein the semiconductor device test board comprises: a circuit board on which the one or more semiconductor devices to be tested are mounted, and wiring is formed for carrying signals and a supply voltage to the semiconductor devices; and one or more indicators, each of which is associated with one of the semiconductor devices for indicating in a visible manner a test result of the semiconductor device, the indicators retaining the test results after the supply voltage is disconnected from the semiconductor devices.

DETAILED DESCRIPTION OF THE PREFERRED EMBODIMENTS

The invention will now be described with reference to the accompanying drawings.

EMBODIMENT 1

Figure 1:
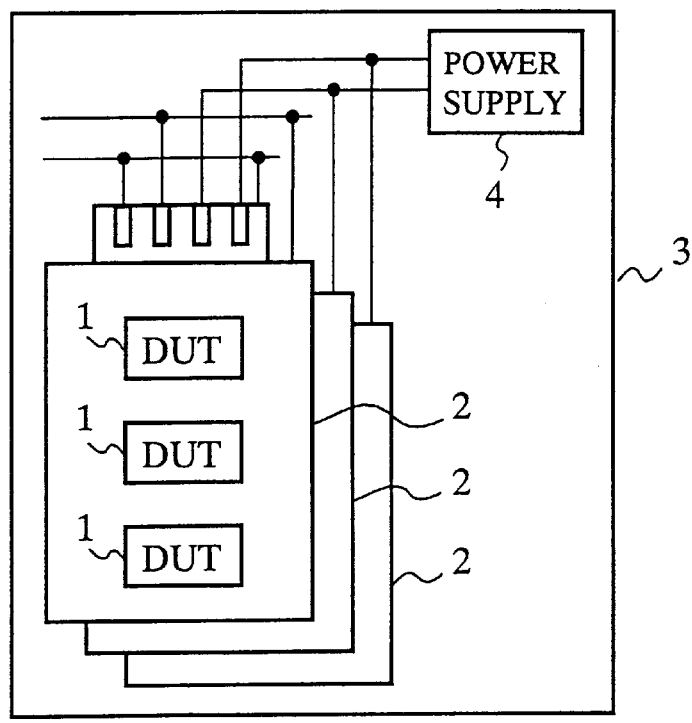
FIG. 1 is a block diagram showing an embodiment 1 of a burn-in system in accordance with the present invention.

FIG. 1 is a block diagram showing a configuration of an embodiment 1 of a burn-in system in accordance with the present invention. In FIG. 1, reference numerals 1 each designate a semiconductor device (DUT: device under test) to be evaluated by a test; 2 each designate a burn-in board (test board) on which a plurality of semiconductor devices 1 are mounted; the reference numeral 3 designates a burn-in oven for heating the semiconductor devices 1 on the burn-in boards 2 contained therein; and 4 designates a power supply integrated into the burn-in oven 3 for supplying power to the burn-in boards 2.

Figure 2:
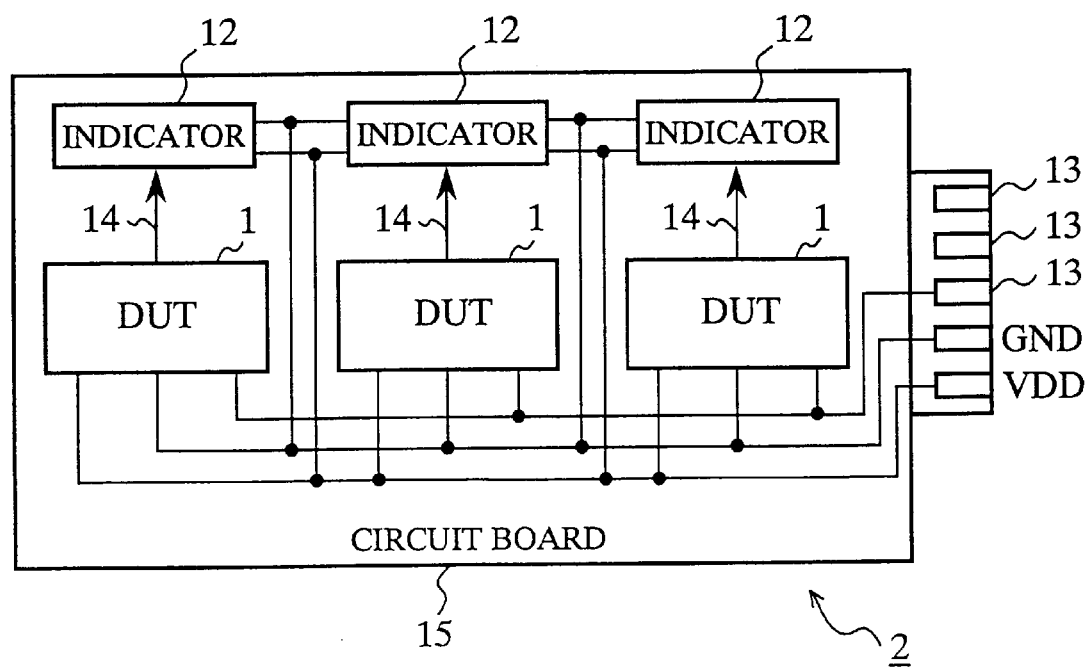
FIG. 2 is a block diagram showing a configuration of a burn-in board of the embodiment 1.

FIG. 2 is a block diagram showing an arrangement of the burn-in board 2 of the embodiment 1. In FIG. 2, the reference numeral 15 designates a circuit board mounted with the semiconductor devices 1 and wiring patterns for supplying signals and voltages to the semiconductor devices 1; reference numerals 13 each designate an input terminal to which a signal or a voltage from the power supply 4 is applied; 12 each designate an indicator for holding the test result of each semiconductor device 1 in a visible state; and 14 each designate a signal line for supplying the indicator 12 with a test result signal from the corresponding semiconductor device 1.

Figure 3:
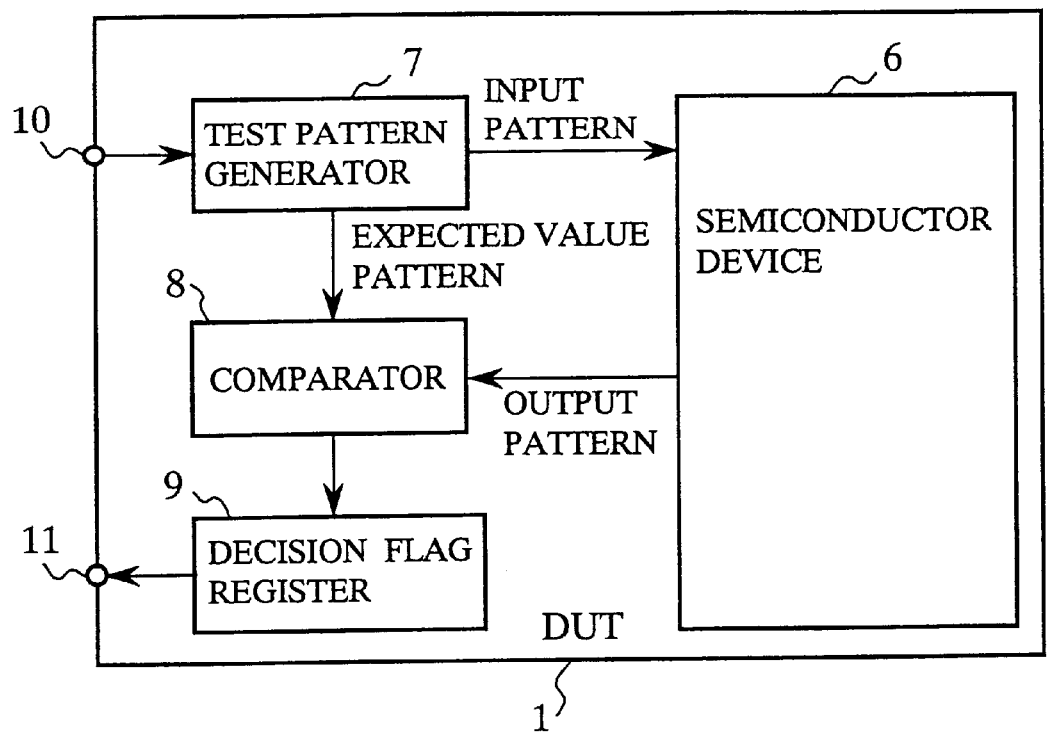
FIG. 3 is a block diagram showing an internal configuration of a semiconductor device 1 of the embodiment 1 including a test circuit.

FIG. 3 is a block diagram showing an internal configuration of the semiconductor device 1. In FIG. 3, the reference numeral 6 designates a semiconductor device to be evaluated; 7 designates a test pattern generator for generating test patterns to be input to the semiconductor device 6; 8 designates a comparator for comparing an output pattern of the semiconductor device 6 with a corresponding expected value pattern output from the test pattern generator 7 in synchronism with the test pattern; 9 designates a decision flag register for storing a comparison result fed from the comparator 8; 10 designates a test input terminal for inputting a start signal or the like to the test pattern generator 7; and 11 designates a flag output terminal for supplying the signal line 14 with the content of the decision flag register 9. Once the comparator 8 detects disagreement, it sets in the decision flag register 9 predetermined data indicating that a failure has occurred in the semiconductor device, and the data is output from the decision flag register 9. Incidentally, a method integrating such a test circuit in a semiconductor device itself to simplify the test is generally called a BIST (Built-In Self Test).

Figure 4:
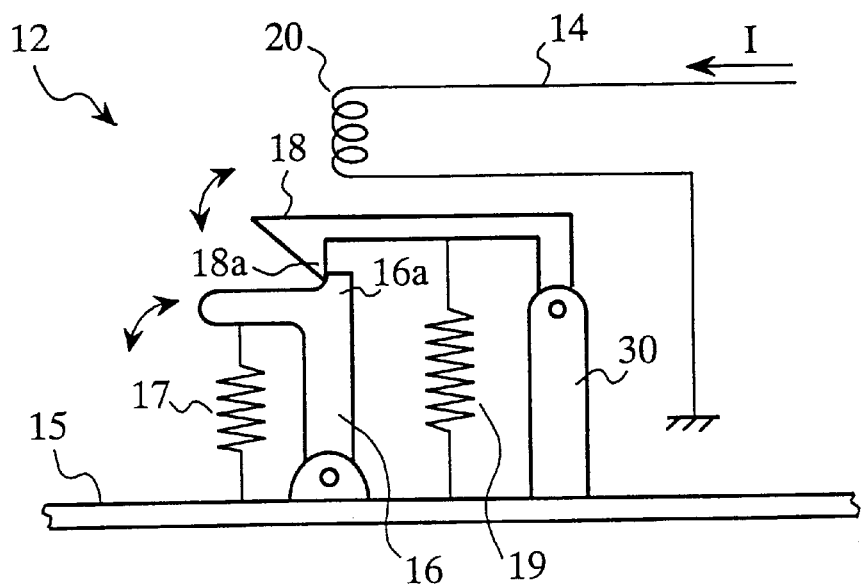
FIG. 4 is a front view showing an arrangement of an indicator in the embodiment 1.

FIG. 4 is a front view showing a structure of the indicator 12 of the present embodiment 1. In FIG. 4, an indicator arm 16 is mounted on a pivot on the circuit board 15 such that it can oscillate in the vertical plane. A spring (exerting means) 17 exerts a force on the arm 16 counterclockwise. A latch arm 18 rotatably mounted on a support member 30 is pulled counterclockwise by a spring 19 such that its catch 18a at its free end is engaged in the free end 16a of the indicator arm 16. Thus, the indicator arm 16 stands upright at its rest position on the circuit board 15. The latch arm 18 experiences a magnetic force attracting it toward a coil 20 when a current flows through the signal line 14 and the coil 20. The current flows only when a failure has occurred in the semiconductor device 6.

Next, the operation of the present embodiment 1 will be described.

When the start signal is applied to the test pattern generator 7 through the test input terminal 10, the test pattern generator 7 produces the test pattern and the corresponding expected value pattern in parallel. Then, the comparator 8 compares the output pattern produced from the semiconductor device 6 in response to the test pattern with the expected value pattern, thereby making a decision whether they agree or disagree. The test result is stored in the decision flag register 9, and is output from the flag output terminal 11 as the test result signal. If the test result indicates disagreement, that is, once a failure has occurred in the semiconductor device 6 in the burn-in process, the test result signal causes a current to flow through the corresponding coil 20 via the signal line 14. Thus, the coil 20 produces a magnetic force which attracts the latch arm 18 and releases its engagement with the indicator arm 16. As a result, the indicator arm 16 turns counterclockwise and falls to the circuit board 15, indicating that the failure has occurred.

Thus, in the present embodiment 1, while placing the burn-in boards 2 in the burn-in oven 3 so that the semiconductor devices 1 are subjected to the burn-in process, the BIST circuit carries out a long cycle test which has been performed, in the conventional burn-in system, at the performance check evaluation test step ST4 after the burn-in process. Here, the long cycle test refers to a test which requires a long test time in the evaluation test performed at the performance check evaluation test step ST4 in the conventional burn-in system, and is carried out by setting a test period at a maximum value of a product specification.

As a result, the time period required for the performance check evaluation test can be reduced by an amount of 30–50% as compared with that in the conventional burn-in system. In addition, since the defective semiconductor devices 1 can be identified by the state of the indicator arm 16, which has fallen to the circuit board 15 if a failure has occurred, after the burn-in boards 2 are taken out of the burn-in oven 3, that is, after the performance check evaluation test, the quality identifying step after the burn-in process needed in the conventional burn-in system can be omitted. As a result, the overall time period of the evaluation test can be reduced by a considerable amount.

Furthermore, since the evaluation test during the burn-in process is carried out by the BIST system in connection with the burn-in boards 2, the LSI tester can be obviated, and the cost is reduced.

As described above, according to the present embodiment 1, the burn-in procedure and the evaluation test can be achieved at the same time using the burn-in boards 2. In addition, since the burn-in boards 2 retain the test results even after they are taken out of the burn-in oven 3, the quality check can be readily carried out based on the test results. Therefore, the burn-in procedure and evaluation test can be achieved without increasing the steps taken thereafter, which enables the timesaving, effective evaluation test of the semiconductor devices 1. Furthermore, since the indicators 12 are entirely composed of mechanical components, it is very rare that they suffer from a failure due to overheating in the burn-in oven.

EMBODIMENT 2

Figure 5:
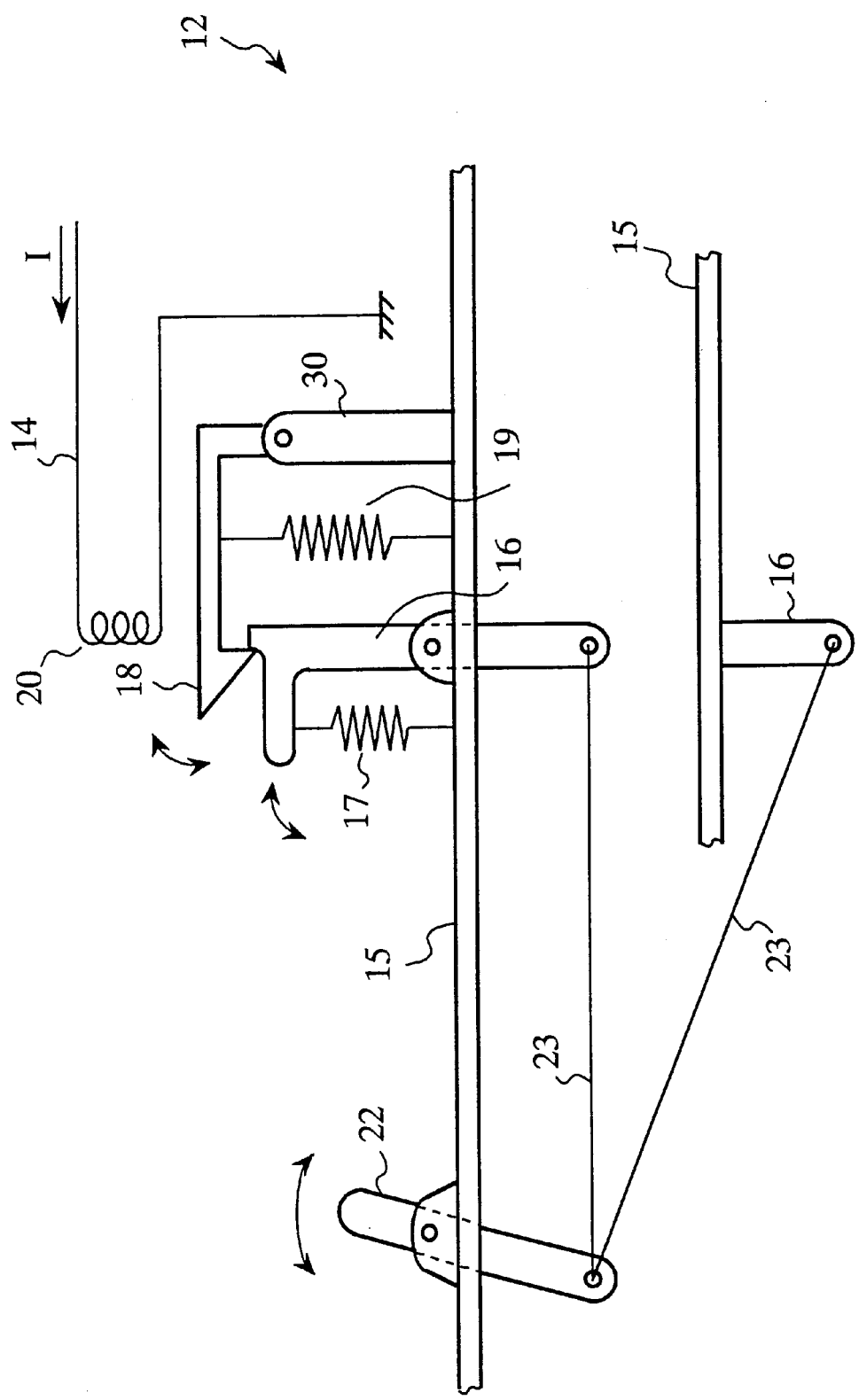
FIG. 5 is a view showing an arrangement of an indicator of a burn-in board with an initializing mechanism in an embodiment 2 of the burn-in system in accordance with the present invention.

FIG. 5 is a diagram showing another indicator of the burn-in board 2 with an initializing mechanism in an embodiment 2 in accordance with the present invention. In FIG. 5, the indicator arms 16 corresponding to respective semiconductor devices 6 are extended under the circuit board 15, and their bottom ends are connected to the bottom end of a initializing lever 22 via wires 23 (both of which function as an initializing means). Thus, turning the initializing lever 22 clockwise will drive the indicator arms 16 clockwise. Since the remaining arrangement is the same as that of the embodiment 1, the description thereof is omitted here by designating the corresponding portions by the same reference numerals.

Next, the operation of the initializing mechanism will be described.

Turning the initializing lever 22 clockwise draws the wires 23, thereby causing the entire indicator arms 16 on the circuit board 15 to be turned clockwise via the wires 23. As a result, each of the entire indicator arms 16 stands upright at its rest position with its free end 16a engaged in the catch 18a at the free end of the latch arm 18.

Thus, the entire indicator arms 16 on each burn-in board 2 can be set in their rest position by turning the initializing lever 22. Since the operation thereafter is the same as that of the embodiment 1, the description thereof will be omitted here.

According to the present embodiment 2, turning the initializing lever 22 rotates all of the indicator arms 16 on the circuit board 15 at the same time, and causes their free ends 16a to be engaged in the catches 18a of the corresponding latch arms 18. This makes it possible to reduce misoperations involved in the initialization of the indicator arms 16 as compared with that of the embodiment 1, in which they are initialized one by one, thereby improving the efficiency of the initialization.

EMBODIMENT 3

Figure 6:
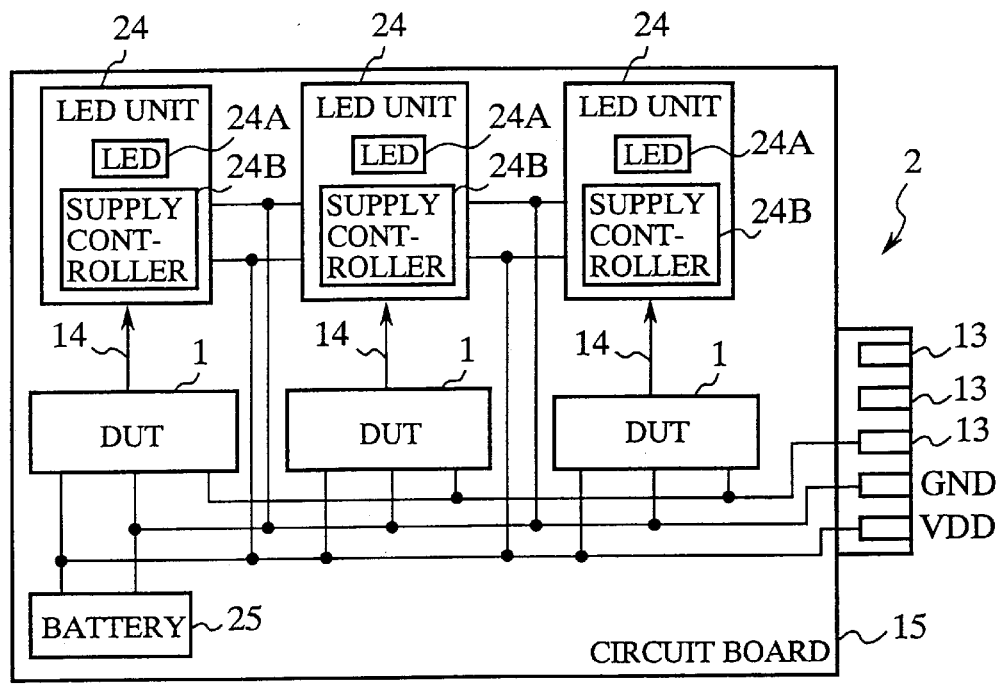
FIG. 6 is a block diagram showing an arrangement of a burn-in board of an embodiment 3 of the burn-in system in accordance with the present invention.

FIG. 6 is a block diagram showing a configuration of the burn-in board 2 of an embodiment 3 in accordance with the present invention. In FIG. 3, reference numerals 24 each designates an LED unit including an LED (Light-Emitting Diode) 24A and a power supply controller 24B, and keeps supplying power to the LED 24A if the test result signal fed through the signal line 14 indicates a failure of the semiconductor device 1. The reference numeral 25 designates a battery (internal power supply) disposed on the circuit board 15 to supply power to the LED units 24 and the semiconductor devices 1. The battery 25 is connected to one of the input terminals 13 so that it is recharged while connected to the power supply 4 (external power supply) as shown in FIG. 1. Since the remaining configuration is the same as that of the embodiment 1, the description thereof is omitted here by designating the corresponding portions by the same reference numerals.

Next, the operation of the present embodiment 3 will be described.

First, the burn-in boards 2, on which the semiconductor devices 1 are mounted, are put in the burn-in oven 3. Thus, the power supply 4 is connected to battery 25 through the input terminal 13, and the battery 25 starts to be recharged. The test is carried out in this state as in the embodiment 1. As a result, if a failure has occurred in the semiconductor device 1, its LED unit 24 is energized by the battery 24, and starts illuminated. It stays illuminated even after the burn-in board 2 is taken out of the burn-in oven 3 after the burn-in process because it is supplied with power from the battery 25.

Thus, the present embodiment 3 can achieve effect and advantage similar to that of the embodiment 1 except that the LEDs 24A or the power supply controllers 24B are liable to suffer from a failure due to overheating in the burn-in oven. Incidentally, since the battery 25 is automatically recharged during the burn-in process, it is not necessary to add another step of recharging, thereby preventing the efficiency of the operation involved in the test from being decreased.

EMBODIMENT 4

Figure 7:
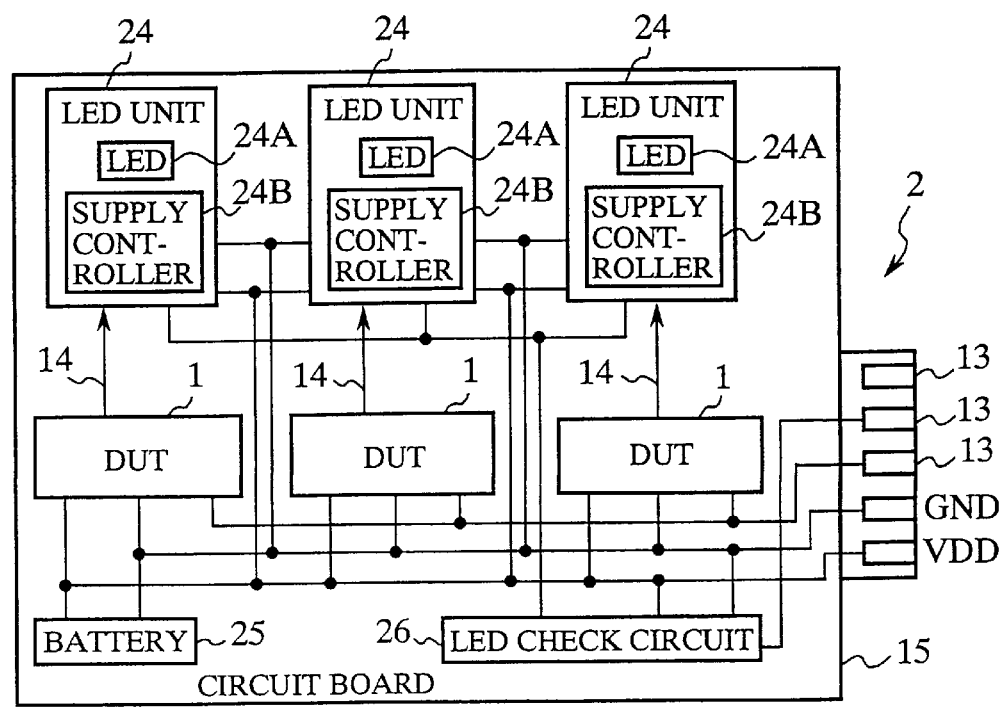
FIG. 7 is a block diagram showing an arrangement of a burn-in board of an embodiment 4 of the burn-in system in accordance with the present invention.
Figure 8:
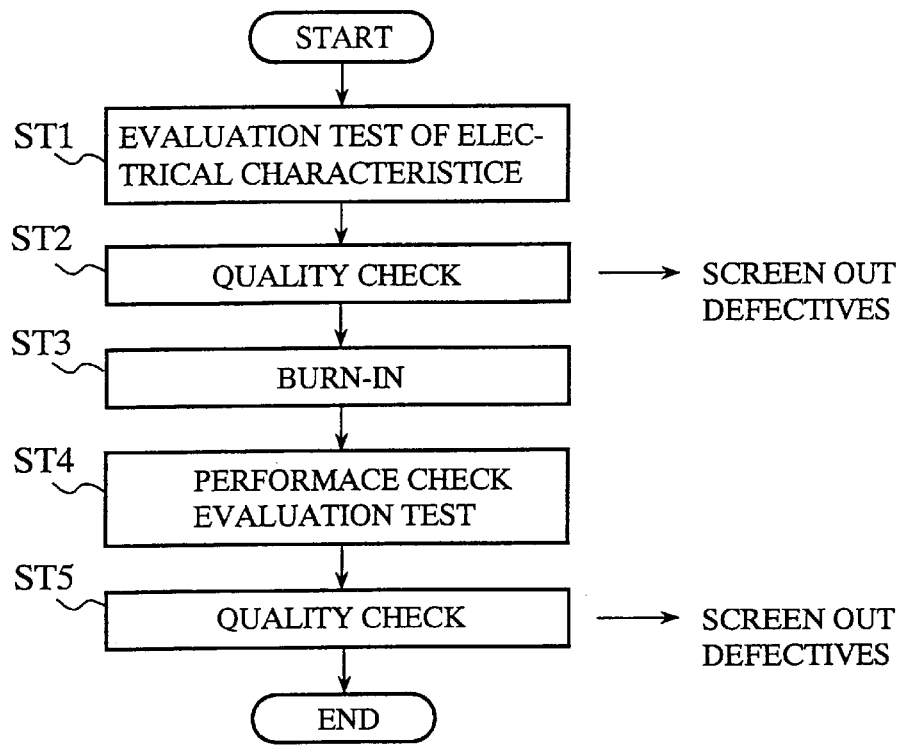
FIG. 8 is a flowchart showing a procedure of a conventional evaluation test method.
Figure 9:
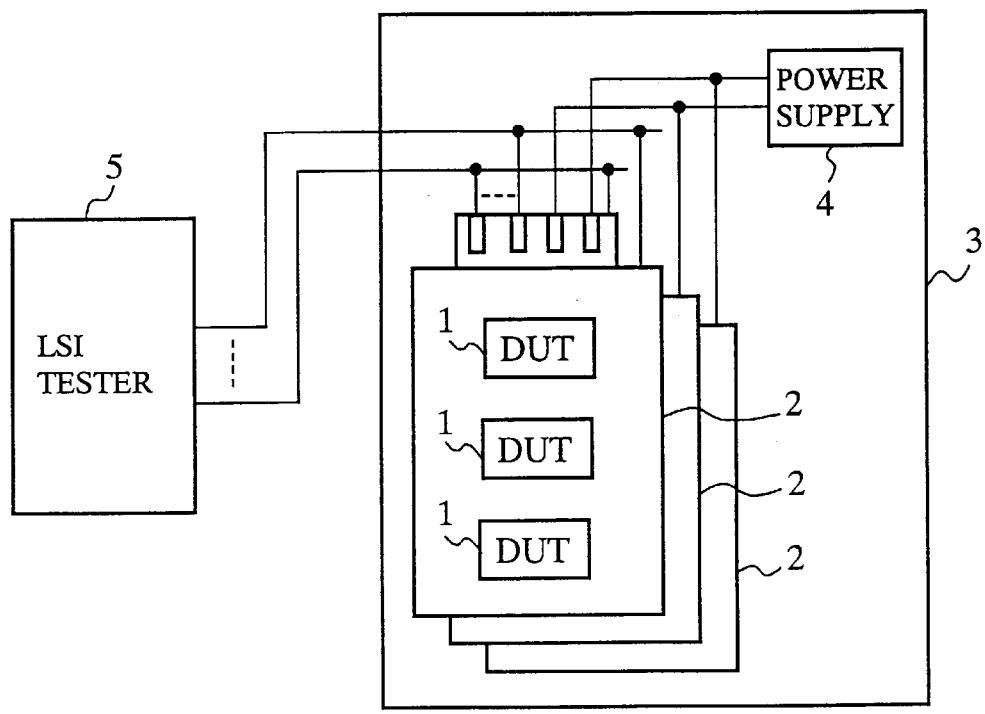
FIG. 9 is a block diagram showing a conventional burn-in system.

FIG. 7 is a block diagram showing a configuration of the burn-in board 2 of an embodiment 4 in accordance with the present invention. In FIG. 7, the reference numeral 26 designates an LED check circuit for checking the LEDs 24A by passing a current through them. The LED check circuit 26 is connected to a power supply line between the battery 25 and one of the input terminals 13. Since the remaining configuration is the same as that of the embodiment 1, its description will be omitted here by designating the corresponding portions by the same reference numerals.

Next, the operation of the present embodiment 4 will be described.

First, the LED check circuit 26 carries out the performance check of the LEDs 24A by passing a current through them. When the entire LEDs 24A function normally, the semiconductor devices 1 are mounted on the circuit board 15 to undergo the burn-in and the test as in the embodiment 3.

According to the present embodiment 4, the performance check of the LEDs 24A can be achieved before the burn-in procedure. Accordingly, a defective LED can be detected beforehand, enabling accurate quality check of the is semiconductor devices 1 in addition to the same effect and advantages of the embodiment 3. As a result, even if any of the LEDs 24A and other semiconductor devices suffer from a failure owing to the heat in the burn-in environment, confusing such a failure with a failure of the semiconductor devices 1 can be avoided.

What is claimed is:

1. A semiconductor device test board comprising:

a circuit board for carrying at least one semiconductor device to be tested, the circuit board including wiring for transferring signals and a supply voltage to the semiconductor device; and at least one indicator mounted on said circuit board, associated with one of said semiconductor devices carried by the circuit board, for visually indicating a result of testing of the semiconductor device, the indicator retaining the result of the test after the supply voltage is disconnected from the semiconductor device, the indicator including:

an indicator arm rotatably mounted on a first pivot on the circuit board, the indicator arm having a free end and a pivot end;

a latch arm rotatably mounted on a second pivot on the circuit board, the latch arm having a free end, a pivot end, and a catch located at the free end of the latch arm, the catch engaging the free end of the indicator arm;

exerting means for exerting a force on the indicator arm in a direction for retaining the indicator arm in a rest position engaging the latch arm; and releasing means for disengaging the latch arm from the indicator arm when a test result of the semiconductor device associated with the indicator indicates a failure in the semiconductor device.

2. The semiconductor device test board as claimed in claim 1, comprising initializing means for simultaneously setting each indicator arm in the rest position.

3. A method for evaluating semiconductor devices comprising:

mounting at least one semiconductor device on a semiconductor device test board;

placing the semiconductor test board in a burn-in oven to undergo an evaluation test;

performing the evaluation test inside the burn-in oven; and visually indicating results of the evaluation test for the semiconductor device, including retaining the results for the semiconductor device after disconnecting power from the semiconductor test board, by disengaging a latch arm rotatable mounted on the semiconductor test board in response to a test result indicating a failure in a semiconductor device being tested, thereby releasing an indicator arm rotatable mounted on the semiconductor test board so that the indicator arm rotates to contact the semiconductor test board in response to a biasing force.

4. The method of claim 3 comprising, before placing the semiconductor test board in a burn-in oven, initializing the indicator arm by engaging the latch arm with the indicator arm so that the indicator arm is in a rest position not touching the semiconductor test board.

* * * * *